(12) United States Patent
Ogata et al.

(10) Patent No.: US 10,792,880 B2
(45) Date of Patent: Oct. 6, 2020

(54) TABLETING PUNCH OR DIE AND TABLETING MACHINE INCLUDING THE SAME

(71) Applicant: TOWA Corporation, Kyoto-shi, Kyoto (JP)

(72) Inventors: Kenji Ogata, Kyoto (JP); Daisuke Higashi, Kyoto (JP)

(73) Assignee: Towa Corporation, Kyoto (JP)

( * ) Notice: Subject to any disclaimer, the term of this patent is extended or adjusted under 35 U.S.C. 154(b) by 29 days.

(21) Appl. No.: 16/093,555

(22) PCT Filed: Nov. 18, 2016

(86) PCT No.: PCT/JP2016/084238
§ 371 (c)(1),
(2) Date: Oct. 12, 2018

(87) PCT Pub. No.: WO2017/179235
PCT Pub. Date: Oct. 19, 2017

(65) Prior Publication Data
US 2019/0176428 A1   Jun. 13, 2019

(30) Foreign Application Priority Data
Apr. 15, 2016   (JP) .................................. 2016-081926

(51) Int. Cl.
*B29C 33/56*   (2006.01)
*B30B 11/02*   (2006.01)
(Continued)

(52) U.S. Cl.
CPC ................. *B30B 11/02* (2013.01); *A61J 3/10* (2013.01); *C23C 14/08* (2013.01)

(58) Field of Classification Search
CPC .... B29C 43/08; B29C 33/56–62; B29C 33/68
See application file for complete search history.

(56) References Cited

U.S. PATENT DOCUMENTS 5,609,922 A * 3/1997 McDonald ................ B22C 9/04
249/114.1
5,738,819 A * 4/1998 Feagin ...................... B22C 1/00
164/15

(Continued)

FOREIGN PATENT DOCUMENTS

CN   101939468 A   1/2011
CN   102149536 A   8/2011

(Continued)

OTHER PUBLICATIONS

Office Action dated Sep. 28, 2017 issued in counterpart Taiwan Application No. 105138361.

(Continued)

*Primary Examiner* — Joseph S Del Sole
*Assistant Examiner* — Thu Khanh T Nguyen
(74) *Attorney, Agent, or Firm* — Procopio Cory Hargreaves and Savitch LLP

(57) ABSTRACT

A tableting punch or a die includes a base material and a tableting surface layer on the base material. The tableting surface layer includes crystalline yttrium oxide containing nitrogen and a group 4A element.

16 Claims, 6 Drawing Sheets

(51) Int. Cl.
*A61J 3/10* (2006.01)
*C23C 14/08* (2006.01)

(56) References Cited

U.S. PATENT DOCUMENTS

| | | |
|---|---|---|
| 2007/0196532 A1 | 8/2007 | Sawaguchi |
| 2010/0330385 A1 | 12/2010 | Sawaguchi et al. |
| 2011/0159137 A1 | 6/2011 | Ando et al. |

FOREIGN PATENT DOCUMENTS

| | | |
|---|---|---|
| CN | 102296261 A | 12/2011 |
| JP | S63-149098 A | 6/1988 |
| JP | H7-80851 A | 3/1995 |
| JP | 2006-315076 A | 11/2006 |
| TW | 201117939 A | 6/2011 |
| WO | 2009/098904 A1 | 8/2009 |
| WO | 2011/043461 A1 | 4/2011 |

OTHER PUBLICATIONS

Office Action dated Jun. 6, 2018 issued in counterpart Taiwan Application No. 105138361.
Extended European Search Report dated Oct. 17, 2019 issued in counterpart European Application No. 16898693.3.
Office Action dated Dec. 3, 2019 issued in counterpart Chinese Application No. 201680084641.7.

* cited by examiner

TABLETING PUNCH OR DIE AND TABLETING MACHINE INCLUDING THE SAME

TECHNICAL FIELD

The present invention relates to a tableting punch or die and a tableting machine including the same.

BACKGROUND ART

PTL 1 discloses a tableting punch or die provided with a coating layer on the surface of a tableting surface layer, wherein the coating layer is formed from any one of chromium nitride, diamond-like carbon, titanium nitride, chromium dope N, titanium carbide, hard chromium plating film, and electroless nickel plating film.

CITATION LIST

Patent Literature

PTL 1: Japanese Patent Laying-open No. 2006-315076

SUMMARY OF INVENTION

Technical Problem

As a tableting punch or die used for tableting a powder material, it is desired to reduce the adhesion amount of the powder material on the tableting punch or die after tableting the powder material.

Solution to Problem

An embodiment disclosed herein relates to a tableting punch or die including a base material and a tableting surface layer on the base material, the tableting surface layer includes crystalline yttrium oxide containing nitrogen and a group 4A element. The term of "crystalline" includes monocrystals, multicrystals, microcrystals and the like, and also includes crystals existing in amorphous state. Whether it is crystalline or not may be confirmed by a common crystallinity evaluation method such as X-ray diffraction method, electron beam diffraction method, Raman spectrometry, channeling method or the like.

An embodiment disclosed herein relates to a tableting machine including the tableting punch or die described in the above.

Advantageous Effects of Invention

According to the embodiments disclosed herein, it is possible to reduce the adhesion amount of the powder material on the tableting punch or die after tableting the powder material.

DESCRIPTION OF EMBODIMENTS

Figure 1:
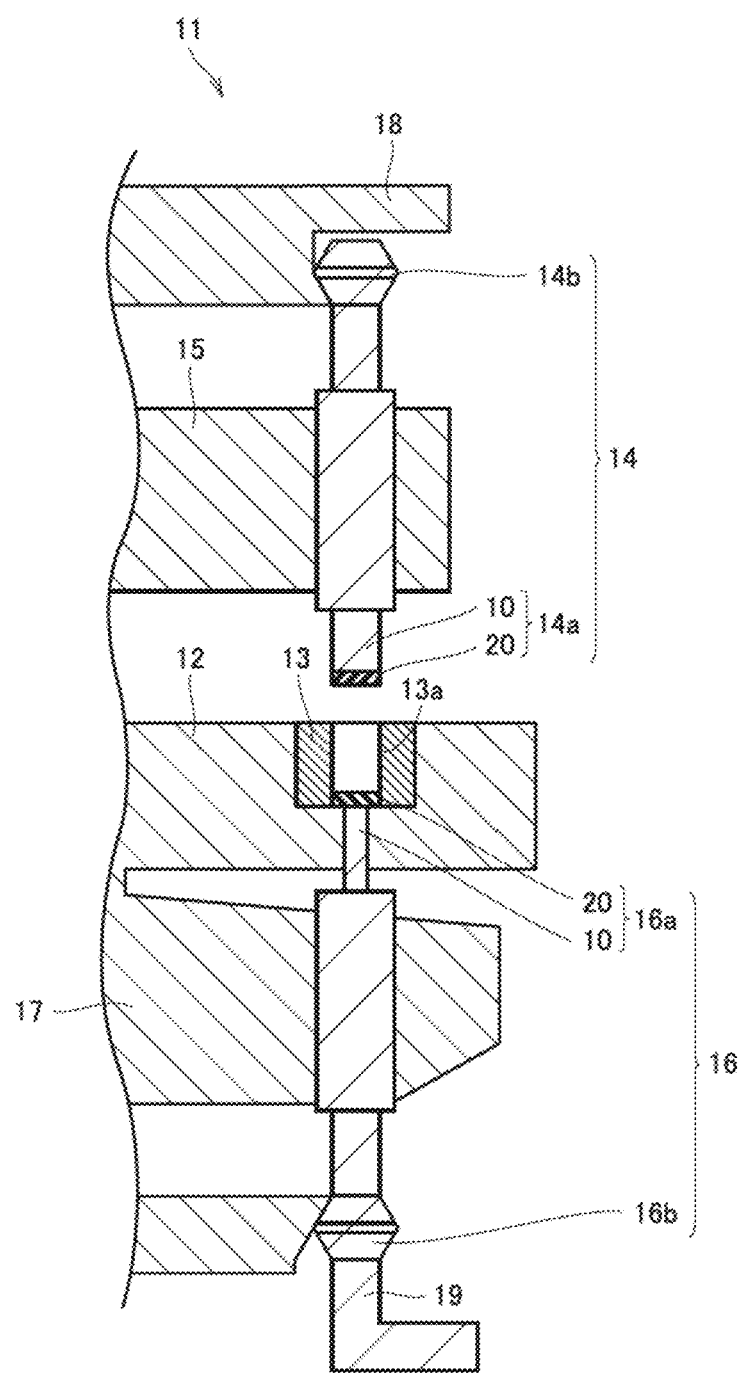
FIG. 1 is a schematic cross-sectional view illustrating a tableting machine according to an embodiment.

Hereinafter, an embodiment will be described. In the drawings for describing the embodiment, the same reference numeral denotes the same or equivalent part.

FIG. 1 is a schematic cross-sectional view illustrating a tableting machine according to an embodiment which is an example of a tableting machine of the present invention. The tableting machine 11 of the embodiment includes an upper punch 14, a lower punch 16, a die 13 with a die hole 13a between the upper punch 14 and the lower punch 16, an upper punch holder 15 for holding the upper punch 14, a lower punch holder 17 for holding the lower punch 16, an upper punch guiding rail 18 for guiding the upper punch 14, a lower punch guiding rail 19 for guiding the lower punch 16, and a turntable 12 on which a plurality of dies 13 are disposed along the circumferential direction with a prescribed interval therebetween.

The upper punch guiding rail 18 is connected to a head portion 14b at the upper end of the upper punch 14, and is configured to hold the upper punch 14 so that the upper punch 14 is movable in the vertical direction with respect to the die hole 13a. For example, as the upper punch 14 is moved downward, a punch tip 14a of the upper punch 14 may approach the die hole 13a and enter into the die hole 13a. As the upper punch 14 is moved upward, the punch tip 14a of the upper punch 14 may leave the die hole 13a and move out of the die hole 13a.

The lower punch guiding rail 19 is connected to a head portion 16b at the lower end of the lower punch 16, and is configured to hold the lower punch 16 so that the lower punch 16 is movable in the vertical direction with respect to the die hole 13a. The lower punch 16 is configured to be movable in the vertical direction within such a range that at least a part of a tableting surface layer 20 on a punch tip 16a at the upper end of the lower punch 16 remains inside the die hole 13a. When the lower punch 16 is at the lowermost position, at least a part of the punch tip 16a of the lower punch 16 remains inside the die hole 13a, and as the lower punch 16 is moved upward, the volume of a space in the die hole 13a decreases as the punch tip 16a of the lower punch 16 rises, and when the lower punch 16 is at the uppermost position, the punch tip 16a of the lower punch 16 may protrude from the upper end of the die hole 13a.

The tableting machine according to the embodiment may prepare tablets in the following manner, for example. First, by driving the turntable 12, the upper punch holder 15 and the lower punch holder 17 to rotate coaxially, the head portion 14b of the upper punch 14 is connected to the upper punch guiding rail 18, and the head portion 16b of the lower punch 16 is connected to the lower punch guiding rail 19. Then, the lower punch 16 is positioned at a predetermined height by the lower punch guiding rail 19, and thereby, the volume of the space in the die hole 13a is set equal to the volume corresponding to the amount of a powder material used for tableting by the punch tip 16a of the lower punch 16.

Next, the powder material used for tableting is filled into the space in the die hole 13a which is set equal to the volume corresponding to the amount of the powder material used for tableting. Thereafter, the upper punch 14 is guided to move downward by the upper punch guiding rail 18, and thereby, the punch tip 14a of the upper punch 14 is inserted into the die hole 13a from the upper end thereof, and accordingly the powder material is compressed between the punch tip 14a of the upper punch 14 and the punch tip 16a of the lower punch 16 to prepare a tablet.

After a tablet is prepared, it may be taken out of the tableting machine according to the embodiment in the following manner, for example. First, the upper punch 14 is moved upward by the upper punch guiding rail 18, and thereby, the punch tip 14a of the upper punch 14 is taken out from the die hole 13a. Next, the lower punch 16 is moved upward by the lower punch guiding rail 19, and thereby, the prepared tablet is lifted above the die hole 13a by the punch tip 16a of the lower punch 16. Thereafter, the tablet lifted above the die hole 13a is scraped out of the tableting machine by a scraper (not shown).

In the tableting machine according to the embodiment, the tableting surface layer 20 disposed on the tip end of the base body 10 of at least one of the punch tip 14a of the upper punch 14 and the punch tip 16a of the lower punch 16 includes crystalline yttrium oxide containing nitrogen and a group 4A element. Therefore, it is possible for the tableting machine according to the embodiment to reduce the adhesion amount of the powder material on the tableting face of the tableting punch or the die after tableting the powder material. As the group 4A element, cation of at least one selected from the group consisting of titanium, zirconium and hafnium may be used. Moreover, whether or not yttrium oxide used in the tableting surface layer 20 is crystalline may be confirmed by a common crystallinity evaluation method such as X-ray diffraction method, electron beam diffraction method, Raman spectrometry, channeling method or the like. Furthermore, whether or not the tableting surface layer 20 includes yttrium oxide containing nitrogen and a group 4A element may be determined by, for example, secondary ion mass spectrometry (SIMS).

The inventors of the present invention have found that crystalline yttrium oxide containing nitrogen and a group 4A element is excellent as a coating material for a tableting punch or a die based on the follow speculations.

For example, when nitrogen substitution ($O^{2-} \rightarrow N^{3-}$) is performed on yttrium oxide ($Y_2O_3$), the covalency is increased, and thereby the polarization is relaxed as compared with the Y—O bonding, which makes it possible to lower the adsorption ability to organic substances.

However, when nitrogen substitution ($O^{2-} \rightarrow N^{3-}$) only is performed on yttrium oxide, anion vacancies (negative ion vacancies or lattice defects) are formed so as to maintain the electricity neutral of the crystal structure. When anion vacancies are present, the adsorption of organic substances may be promoted due to the vacancies.

In order to cancel the valence difference of 1 between $N^{3-}$ and $O^{2-}$ so as to suppress the formation of anion vacancies, cation of a group 4A element which has the valence number larger than $Y^{3+}$ by 1 and may solutionize in $Y_2O_3$ to replace $Y^{3+}$ may be added to yttrium oxide.

Therefore, yttrium oxide of the present embodiment may be considered as a solid solution having such a crystal structure that a part of yttrium is substituted by a group 4A element and a part of oxygen is substituted by nitrogen.

Yttrium oxide of the present embodiment may contain, as a group 4A element, at least one element selected from the group consisting of titanium (Ti), zirconium (Zr), hafnium (Hf) and rutherfordium (Rf), and in particular may contain at least one of Zr and Hf.

The substitution amount (content) of cation of a group 4A element in yttrium oxide of the present embodiment may be more than 0 mol % and 20 mol % or less in being converted into $MeO_2$ (Me is a group 4A element). When the substitution amount of cation is 20 mol % or less, for example, Zr or Hf is within the solid-solubility limit with respect to yttrium oxide matrix, and thereby, it is difficult for the composite oxide (composed of yttrium oxide and zirconium oxide) or hafnium oxide to precipitate, which makes it possible to further inhibit the adhesion of the powder material. More specifically, the substitution amount of cation of a group 4A element in yttrium oxide of the present embodiment may be more than 0 mol % and 10 mol % or less.

From the above, yttrium oxide of the present embodiment may contain at least one of Zr and Hf as a group 4A element at a content of more than 0 mol % and not more than 20 mol % or less, and more specifically more than 0 mol % and 10 mol % or less in being converted into $MeO_2$ (Me is a group 4A element).

Further, the content of nitrogen in yttrium oxide of the present embodiment may be 0.01 mol % or more and 20 mol % or less. When the content of nitrogen in yttrium oxide of the present embodiment is 0.01 mol % or more, the substitution amount of nitrogen in yttrium oxide is not too small, which makes it possible to suppress the adhesion of the powder material. When the content of nitrogen in yttrium oxide of the present embodiment is 20 mol % or less, the crystal structure of yttrium oxide is further stabilized, which makes it possible to maintain the effect of suppressing the adhesion of the powder material stably for a longer period. In order to maintain a requirement of the electricity neutral, it is supposed that the maximum substitutable amount of nitrogen is preferably equal to the amount of cations added to the same material. Taken into consideration the balance between the further suppression on the adhesion of the powder material and the further stabilization on the crystal structure of yttrium oxide, the content of nitrogen (the concentration of nitrogen ion (anion)) in yttrium oxide of the present embodiment may be 0.01 mol % or more and 10 mol % or less.

Crystalline yttrium oxide which is used in the tableting surface layer 20 and contains nitrogen and a group 4A element and may not contain any allergy-inducing metal elements or poisonous metal elements such as Hg, Ni, Cr, Co, Cu, Sn, Au, Pt, Pd, Sb, Ag, Fe or Zn.

Figure 2:
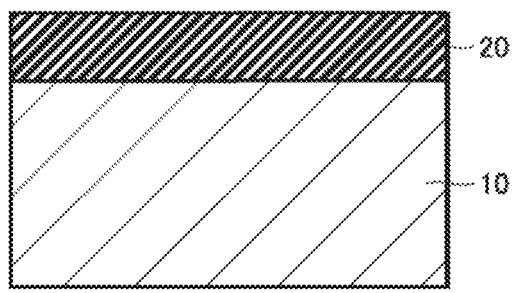
FIG. 2 is a schematic enlarged sectional view illustrating an example of a punch tip used in the tableting machine according to the embodiment.

FIG. 2 is a schematic enlarged sectional view illustrating an example of a punch tip used in the tableting machine according to the embodiment. As the base material 10 used in the punch tip, for example, a metal base material such as an iron-based material (such as stainless steel, carbon steel, alloyed steel, alloyed tool steel, high speed steel, pre-hardened steel) or a non-ferrous material (such as copper-based material, aluminum-based material, hard metal-based material) may be used. If an iron-based material or a non-ferrous material is used as the base material 10, it is possible to make the punch tip excellent in workability and it is unlikely for cracking and chipping to occur therein.

When a metal base material is used as the base material 10, the base material 10 may be formed by a conventional metal processing method such as cutting or electric discharge machining. In addition, the tableting surface layer 20 containing yttrium oxide, nitrogen and cation of a group 4A element can be formed on the surface of the tip end of the base material 10 by physical vapor deposition (PVD) such as sputtering or ion plating, for example.

In the example illustrated in FIG. 2, the thickness of the tableting surface layer 20 may be, for example, about 0.1 μm to 5 μm. In the example illustrated in FIG. 2, if an adhesive layer is included between the base material 10 and the tableting surface layer 20, the thickness of the adhesive layer may be, for example, about 0.01 μm to 1 μm.

Figure 3:
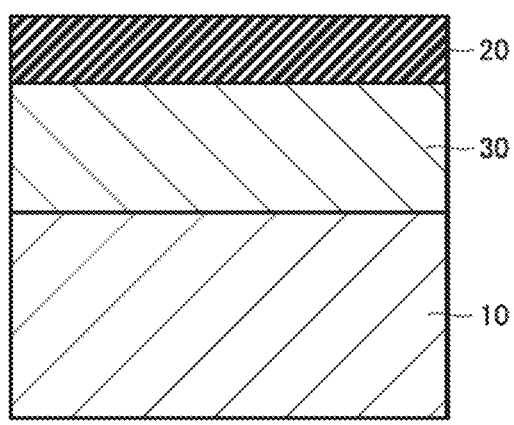
FIG. 3 is a schematic enlarged sectional view illustrating another example of a punch tip used in the tableting machine according to the embodiment.

FIG. 3 is a schematic enlarged sectional view illustrating another example of a punch tip used in the tableting machine according to the embodiment. The example illustrated in FIG. 3 is characterized in that an intermediate layer 30 is provided between the base body 10 and the tableting surface layer 20. As the intermediate layer 30, such a layer that includes a portion which has a hardness higher than that of the base material 10 and a toughness higher than that of the tableting surface layer 20 may be used. As a result, it is possible to prevent cracking from occurring in the tableting surface layer 20 and/or prevent the tableting surface layer 20 from being detached from the base body 10.

In the example illustrated in FIG. 3, the thickness of the intermediate layer 30 may be, for example, about 0.2 μm to 5 μm. In the example illustrated in FIG. 3, the thickness of the intermediate layer 30 may be, for example, about 0.1 μm to 5 μm.

Figure 4:
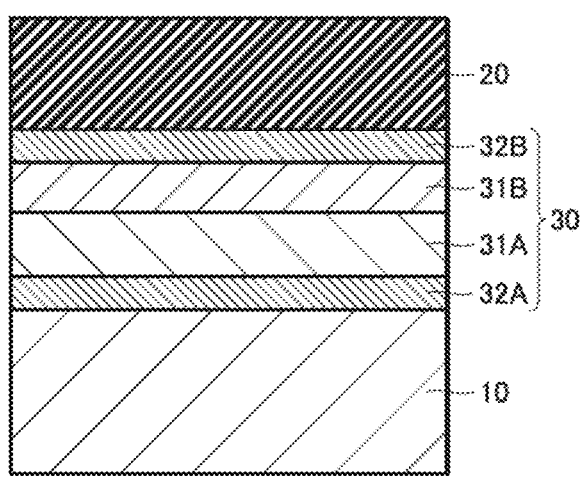
FIG. 4 is a schematic enlarged sectional view illustrating another example of a punch tip used in the tableting machine according to the embodiment.

FIG. 4 is a schematic enlarged sectional view illustrating another example of a punch tip used in the tableting machine according to the embodiment. In the example illustrated in FIG. 4, the intermediate layer 30 is composed of a laminated body in which a first adhesive layer 32A, a first buffer layer 31A, a second buffer layer 31B, and a second adhesive layer 32B are laminated in this order from the side of the base material 10. The adhesive layer is a layer for improving the adhesive strength between the layers disposed on both sides of the adhesive layer. The buffer layer is a layer for buffering the difference in hardness and/or the difference in toughness between the layers disposed on both sides of the buffer layer. In some cases, an adhesive layer may function as a buffer layer, and a buffer layer may function as an adhesive layer.

Figure 5:
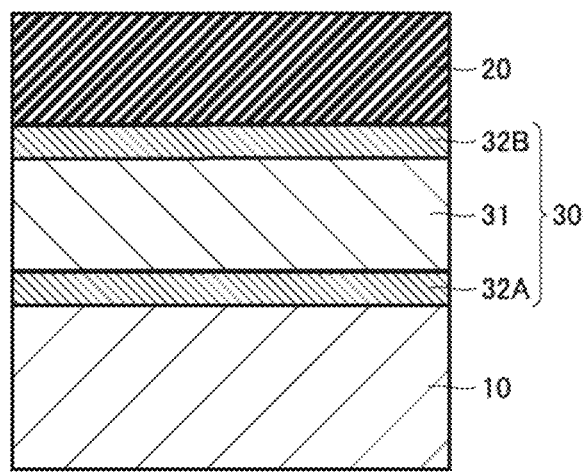
FIG. 5 is a schematic enlarged sectional view illustrating another example of a punch tip used in the tableting machine according to the embodiment.

FIG. 5 is a schematic enlarged sectional view illustrating another example of the punch tip used in the tableting machine according to the embodiment. In the example illustrated in FIG. 5, the intermediate layer 30 is composed of a laminated body in which a first adhesive layer 32A, a buffer layer 31, and a second adhesive layer 32B are laminated in this order from the side of the base material 10.

Figure 6:
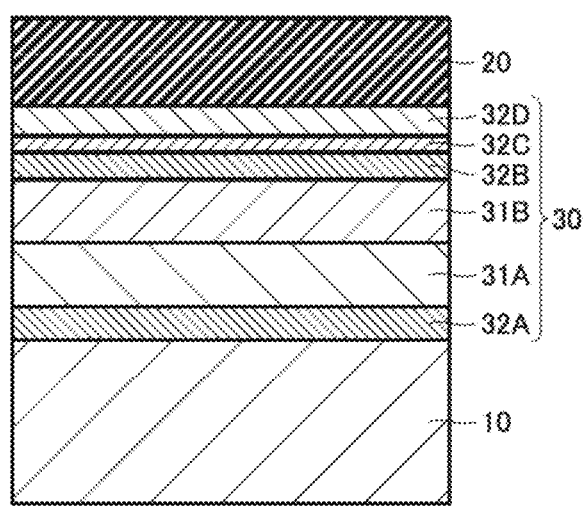
FIG. 6 is a schematic enlarged sectional view illustrating another example of a punch tip used in the tableting machine according to the embodiment.

FIG. 6 is a schematic enlarged sectional view illustrating another example of the punch tip used in the tableting machine according to the embodiment. In the example illustrated in FIG. 6, the intermediate layer 30 is composed of a laminated body in which a first adhesive layer 32A, a first buffer layer 31A, a second buffer layer 31B, a second adhesive layer 32B, a third adhesive layer 32C, and a fourth adhesive layer 32D are laminated in this order from the side of the base material 10.

In other words, the buffer layer may be a multilayer as illustrated in FIGS. 4 and 6, or may be a monolayer as illustrated in FIG. 5. Similarly, the adhesive layer may be composed of a monolayer on both sides of the buffer layer as illustrated in FIGS. 4 and 5, or may be composed of a multilayer on one side of the buffer layer and a monolayer disposed on the other side of the buffer layer as illustrated in FIG. 6. Furthermore, the adhesive layer may be composed of a multilayer on both sides of the buffer layer, respectively.

In the intermediate layer 30 of FIG. 4, an adhesive layer composed of a monolayer or a multilayer may be provided between the buffer layers 31A and 31B which serve as the intermediate layer substantially. In the case where an adhesive layer is provided between the above-mentioned buffer layer (substantially the intermediate layer) and another layer, the intermediate layer may include the adhesive layer.

Further, in the example illustrated in FIG. 5, the buffer layer 31 and the base material 10 may be bonded directly. Furthermore, in the example illustrated in FIG. 5, the buffer layer 31 and the tableting surface layer 20 may be bonded directly.

Both the buffer layer and the adhesive layer may be formed, for example, by physical vapor deposition (PVD) such as sputtering or ion plating.

The hardness of the buffer layer may vary so as to increase, for example, from the side of the base material 10 which is made of a metal base material having a lower hardness toward the side of the tableting surface layer 20 having a higher hardness. For example, as illustrated in FIGS. 4 and 6, in the case where the buffer layers 31A and 31B form a laminated structure, if the hardness of the buffer layer 31B on the side of the tableting surface layer 20 is made higher than that of the buffer layer 31A on the side of the base material 10 made of metal base material or the like, the hardness thereof may be varied in a stepwise manner such that the hardness of at least a surface portion on the side of the tableting surface layer 20 is higher than the hardness of the base material 10. Further, as illustrated in FIG. 5, in the case where the buffer layer 31 has a monolayer structure, the hardness thereof may be continuously varied by varying the composition of the buffer layer in the thickness direction (for example, by reducing the nitrogen concentration as approaching to the base body 10 made of metal base material or the like).

The buffer layer may be made of a nitride, a carbide or an oxide having a general formula of M-A (M is titanium, chromium, nickel, zirconium, aluminum or silicon, and A is nitrogen, carbon or oxygen).

The adhesive layer may be, for example, a layer containing at least one metal selected from the group consisting of titanium, chromium, nickel, zirconium, yttrium, aluminum and silicon, or an oxide of the metal. In other words, the adhesive layer is made of, for example, a metal simple substance such as titanium, chromium, nickel, zirconium, yttrium, aluminum or silicon or a mixture thereof, or an oxide of each metal simple substance or an oxide containing a plurality of metals mentioned above.

The material constituting the buffer layer and the material constituting the adhesive layer may be selected and combined appropriately. The (total) thickness of the buffer layer may be, for example, about 0.2 μm to 5 μm.

It should be noted that the term of "punch" as used herein may include a member in contact with the tablet when making tablets or may be a tip member detachable from a main body fixed to the tableting machine. Also, the term of "tableting surface layer" as used herein refers to the outermost surface layer of a punch or die provide with an outermost surface serving as a contact surface in contact with the powder material to be compressed at the time of tableting.

The upper punch 14, the lower punch 16 and the die 13 of the tableting machine according to the embodiment may be used for tableting at least one selected from the group consisting of pharmaceuticals, agricultural chemicals, fertilizers, foods and toiletries.

Pharmaceuticals are used for diagnosis, treatment or prevention of diseases of humans and animals, and as a pharmaceutical which is particularly liable to bring about tableting problems, for example, 2-[[6-[(3R)-3-amino-1-piperidinyl]-3, 4-dihydro-3-methyl-2, 4-dioxo-1(2H)-pyrimidinyl] methyl]-benzonitrile (generic name: Alogliptin) or a salt thereof, ibuprofen, vitamin C, ascorbic acid, trimebutine maleate or the like may be given, but there are various other pharmaceuticals besides this.

In the present specification, the term of "tableting trouble" refers to an unfavorable phenomenon such as sticking (a phenomenon in which the powder material adheres to the punch), binding (a phenomenon in which the friction between the die and a tablet becomes large), capping (a phenomenon in which tablets are detached in a cap shape), or laminating (a phenomenon in which tablets are detached in layers) or the like which may occur during tableting.

Agricultural chemicals are chemicals used for improving the efficiency of agriculture or for preserving agricultural crops, and as examples of the agricultural chemicals, bactericides, antifungal agents, insecticides, herbicides, rodenticides, plant growth regulators (such as plant hormone agents) and the like may be given.

Fertilizers are provided directly to plants or indirectly to plants via soil as nutrients for growing the plants, and as examples of the fertilizers, organic fertilizers such as fish lees, bone meal, plant strained lees or chemical fertilizers such as ammonium sulfate, urea, ammonium nitrate, ammonium chloride, ammonium phosphate, superphosphate, triple superphosphate, processed phosphate fertilizer, potassium sulfate, or potassium chloride may be given.

Foods are mainly consumed by human as meals, and as examples of foods, tableted confectionery, health foods including supplements, or curry base may be given.

Toiletries are used for cleaning or caring body, personal preference or the like, and as examples of toiletries, bath agents, detergents, non-chlorine slime removing agents, aromatic agents, insect repellent and the like may be given.

EXAMPLES

<Preparation of Upper Punch and Lower Punch of Working Example>

An upper punch and a lower punch of a working example were prepared by forming a tableting surface layer including crystalline yttrium oxide containing nitrogen and a group 4A element by using PVD method on the surface of a tip end (11.3 mm in diameter) of a base material of each of an upper punch and a lower punch for making flat tablets of B-type in TSM standards.

<Preparation of Upper Punch and Lower Punch of Comparative Example>

An upper punch and a lower punch of a comparative example were prepared by forming a tableting surface layer made of hard chromium (HCr) plating film on the surface of the tip end of each of an upper punch and a lower punch of B-type in TSM standards.

<Preparation of Powder Material No. 1>

A powder mixture containing 20% by mass of ibuprofen (IBU) as the main agent, 11.1% by mass of lactose as an excipient, 4.7% by mass of corn starch as a binding agent, 63.2% by mass of crystalline cellulose as a disintegrating agent, and 1% by mass of silica as a fluidizing agent was prepared. Then, 0.5 part by mass of magnesium stearate was mixed as a lubricant with 100 parts by mass of the powder mixture to prepare powder material No. 1.

<Preparation of Powder Material No. 2>

A powder mixture containing 40% by mass of IBU, 8.3% by mass of lactose, 3.5% by mass of corn starch, 47.2% by mass of crystalline cellulose and 1% by mass of silica was prepared. Then, 0.5 part by mass of magnesium stearate was mixed with 100 parts by mass of the powder mixture to prepare powder material No. 2.

<Preparation of Powder Material No. 3>

A powder mixture containing 60% by mass of IBU, 5.5% by mass of lactose, 2.3% by mass of corn starch, 31.2% by mass of crystalline cellulose and 1% by mass of silica was prepared. Then, 0.5 part by mass of magnesium stearate was mixed with 100 parts by mass of the powder mixture to prepare powder material No. 3.

The compositions of the powder materials No. 1 to No. 3 prepared as in the above are summarized in the following Table 1.

TABLE 1

| | Powder Material No. | | |
| --- | --- | --- | --- |
| | 1 | 2 | 3 |
| Ibuprofen | 20 | 40 | 60 |
| Lactose | 11.1 | 8.3 | 5.5 |
| Corn starch | 4.7 | 3.5 | 2.3 |
| Crystalline cellulose | 63.2 | 47.2 | 31.2 |
| Silica | 1 | 1 | 1 |
| Magnesium stearate | 0.5 | 0.5 | 0.5 |

<Confirmation Test on Adhesion Amount of Powder Material on Tableting Surface Layer of Upper Punch and Lower Punch>

The upper punch and the lower punch of the working example prepared as described in the above were attached to a tableting machine (TK-TB-50KN) manufactured by Tokushu Keisoku Co. Ltd., and the tableting surface layer of each of the upper punch and the lower punch of the example was used as the tableting face to make tablets from the powder materials No. 1 to No. 3, each tablet (2 g in mass) having a shape of a diameter of 11.3 mm and a thickness of 3 mm. After tableting (for 100 shots), the surface condition of the tableting surface layer of each of the upper punch and the lower punch of the example was confirmed.

Except that the upper punch and the lower punch of the comparative example were attached instead of the upper punch and the lower punch of the working example, tablets were prepared from the powder materials No. 1 to No. 3 in the same manner and under the same conditions as described in the above. After tableting (for 100 shots), the surface condition of the tabling surface layer of each of the upper punch and the lower punch of the comparative example was confirmed.

A two-step compression including a pre-compression and a main compression was used in tableting, the load applied in tableting was 9 to 12 kN, and the moving speed of the punch was 70 mm/sec. The test conditions for confirming the adhesion amount are summarized in the following Table 2.

TABLE 2

| | |
|---|---|
| Tableting machine | TK-TB-50KN by Tokushu Keisoku Co. Ltd. |
| Punch | 11.3 mm in diameter, upper punch and lower punch for making flat tablets (of B-type in TSM standards) |
| Compression method | compression by lower punch (two-step compression including pre-compression and main compression) |
| Load | 9 to 12 kN |
| Moving speed of punch | 70 mm/sec |
| Tablet shape | 11.3 mm (diameter) × 3 mm (thickness) |

Figure 7:
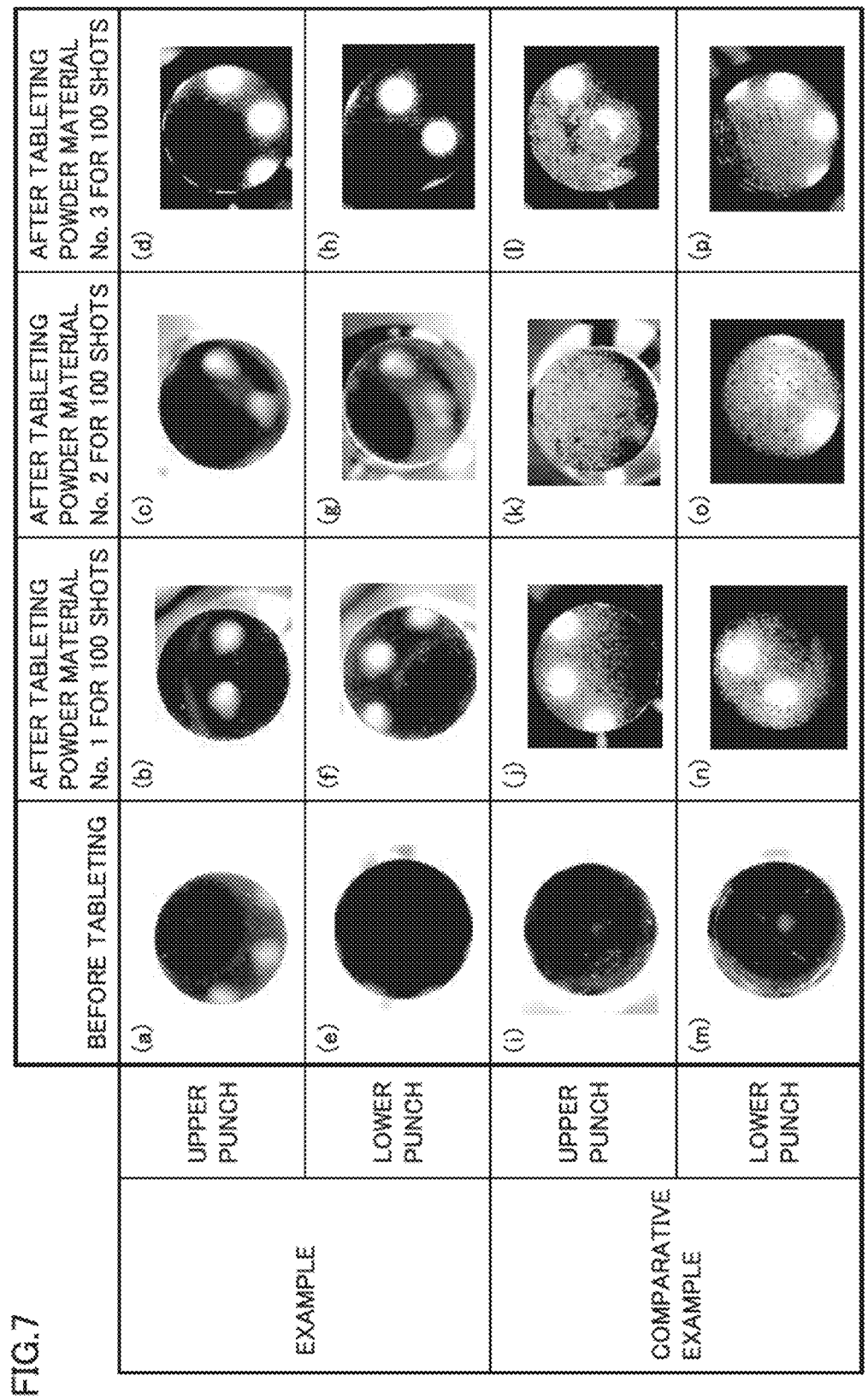
FIG. 7 is a graph illustrating the surface condition of a tableting surface layer before and after tableting the powder materials No. 1 to No. 3 for 100 shots by using an upper punch and a lower punch according to an example and an upper punch and a lower punch according to a comparative example, respectively.

FIG. 7 illustrates the surface condition of the tableting surface layer of each of the upper punch and the lower punch according to the working example and the surface condition of the tableting surface layer of each of the upper punch and the lower punch according to the comparative example before and after tableting the powder materials No. 1 to No. 3 for 100 shots. As illustrated in FIG. 7, compared with the surface condition of the tableting surface layer of the upper punch of the working example before tableting (FIG. 7(a)), no significant change was observed on the surface condition of the tableting surface layer of the upper punch of the working example after tableting the powder material No. 1 (FIG. 7 (b)), the surface condition of the tableting surface layer of the upper punch of the working example after tableting the powder material No. 2 (FIG. 7 (c)), or the surface condition of the tableting surface layer of the upper punch of the working example after tableting the powder material No. 3 (FIG. 7 (d)). In particular, the adhesion of powder material on the tableting surface layer of the upper punch of the working example after tableting the powder materials No. 1 and No. 2 was not observed, and the adhesion of powder material on the tableting surface layer of the upper punch of the working example after tableting the powder material No. 3 was slight but observable.

Compared with the surface condition of the tableting surface layer of the lower punch of the working example before tableting (FIG. 7(e)), no significant change was observed on the surface condition of the tableting surface layer of the lower punch of the working example after tableting the powder material No. 1 (FIG. 7 (f)), the surface condition of the tableting surface layer of the lower punch of the working example after tableting the powder material No. 2 (FIG. 7 (g)), and the surface condition of the tableting surface layer of the lower punch of the working example after tableting the powder material No. 3 (FIG. 7 (h)). Similar to the upper punch of the working example, the adhesion of powder material on the tableting surface layer of the lower punch of the working example after tableting the powder materials No. 1 and No. 2 was not observed, and the adhesion of powder material on the tableting surface layer of the lower punch of the working example after tableting the powder material No. 3 was slight but observable.

On the other hand, compared with the surface condition of the tableting surface layer of the upper punch of the comparative example before tableting (FIG. 7(i)), significant change was observed on the surface condition of the tableting surface layer of the upper punch of the comparative example after tableting the powder material No. 1 (FIG. 7 (j)), the surface condition of the tableting surface layer of the upper punch of the comparative example after tableting the powder material No. 2 (FIG. 7 (k)), and the surface condition of the tableting surface layer of the upper punch of the comparative example after tableting the powder material No. 3 (FIG. 7 (l)). In particular, the adhesion of a white film on the tableting surface layer of the upper punch of the comparative example after tableting the powder material No. 1 was observed, and on the tableting surface layer of the upper punch of the comparative example after tableting the powder material No. 2, the adhesion of a white film on the tableting surface layer and the deposition of the powder material on the white film were observed. Further, on the tableting surface layer of the upper punch of the comparative example after tableting the powder material No. 3, the adhesion of the white film on the tableting surface layer and the agglomeration of the powder material on the white film were observed.

Compared with the surface condition of the tableting surface layer of the lower punch of the comparative example before tableting (FIG. 7(m)), significant change was observed on the surface condition of the tableting surface layer of the lower punch of the comparative example after tableting the powder material No. 1 (FIG. 7 (n)), the surface condition of the tableting surface layer of the lower punch of the comparative example after tableting the powder material No. 2 (FIG. 7 (o)), and the surface condition of the tableting surface layer of the lower punch of the comparative example after tableting the powder material No. 3 (FIG. 7 (p)). Similar to the upper punch of the comparative example, the adhesion of a white film on the tableting surface layer of the lower punch of the comparative example after tableting the powder material No. 1 was observed, and on the tableting surface layer of the lower punch of the comparative example after tableting the powder material No. 2, the adhesion of a white film on the tableting surface layer and the deposition of the powder material on the white film were observed. Further, on the tableting surface layer of the lower punch of the comparative example after tableting the powder material No. 3, the adhesion of the white film on the tableting surface layer and the agglomeration of the powder material on the white film were observed.

Therefore, from the results illustrated in FIG. 7, it was confirmed that the upper punch and the lower punch of the working example can reduce the adhesion amount of the powder material as compared with the upper punch and the lower punch of the comparative example. From the results illustrated in FIG. 7, it was also confirmed that the adhesion amount of the powder material tends to increase in proportion to the content of IBU in the powder material.

<Confirmation Test on Surface Condition of Tablet by Tableting Powder Material not Containing Lubricant>

Except that magnesium stearate which serves as a lubricant was not mixed, a powder material No. 4 was prepared in the same manner as the powder material No. 3. In other words, the powder material No. 4 was a powder mixture containing 60% by mass of IBU, 5.5% by mass of lactose, 2.3% by mass of corn starch, 31.2% by mass of crystalline cellulose, and 1% by mass of silica.

Then, the upper punch and the lower punch of the example were attached to a tableting machine (TK-TB-50KN) manufactured by Tokushu Keisoku Co. Ltd., and the tableting surface layer of each of the upper punch and the lower punch of the example was used as the tableting face to make tablets from the powder materials No. 4 by continuous tableting. Then, the surface condition of each tablet after tableting continuously for 1 shot, 3 shots and 400 shots was confirmed.

Except that the upper punch and the lower punch of the comparative example were attached instead of the upper punch and the lower punch of the working example, tablets were prepared by continuously tableting the powder material No. 4 in the same manner and under the same conditions as described in the above. Then, the surface condition of each tablet after tableting continuously for 1 shot, 3 shots and 30 shots was confirmed.

The surface condition of each tablet was confirmed as follows. First, the "MICRO SCOPE VHX-5000" manufactured by KEYENCE was employed as a measuring device to photograph the surface of each tablet by using a CCD camera at a magnifying power of 20 times under coaxial vertical illumination having an intensity of 20. Then, a binarization process was performed on the photographed image of the surface of each tablet to set a threshold so that muddy portions, minute irregularities and defected portions on the surface of each tablet are displayed darkly and the smooth portions are displayed in red, and the ratio [%] of the area of the red portions to the area of the entire surface of each tablet (area ratio of the smooth portions) was calculated. The results are shown in FIG. 8.

Figure 8:
FIG. 8 is a graph illustrating an image of the surface of each tablet obtained after tableting the powder material No. 4 for 1 shot, 3 shots and continuous shots by using an upper punch and a lower punch according to an example and a comparative example, respectively, and a corresponding image thereof after binarization processing.

As shown in FIG. 8, when the upper punch and the lower punch of the working example were used to make continuous tableting, the area ratio of the smooth portions on the surface of the tablet after continuous tableting for 1 shot, 3 shots and 400 shots was 71%, 70% and 80%, respectively, it was confirmed the smoothness of the surface of the tablet was maintained even after continuous tableting for 400 shots, and thereby, the tablet may be dispatched as product (indicated as "OK" in FIG. 8).

On the other hand, as illustrated in FIG. 8, when the upper punch and the lower punch of the comparative example were used to make continuous tableting, the area ratio of the smooth portions on the surface of the tablet after continuous tableting for 1 shot, 3 shots and 30 shots is 59%, 54% and 51%, respectively, it was confirmed that the tablet can not be dispatched as product even after continuous tableting for 3 shots (indicated as "NG" in FIG. 8), and the smoothness of the surface of the tablet can not be recovered even after continuous tableting for 30 shots.

Therefore, from the results illustrated in FIG. 8, it was confirmed that the upper punch and the lower punch of the working example may improve the smoothness of the surface of the tablet after continuous tableting, and thereby may be used for a longer time as compared with the upper punch and the lower punch of the comparative example.

In the case of tableting a powder material not containing a lubricant, the smoothness of the surface of the tablet after tableting is usually very low. Nevertheless, the required smoothness could be achieved under such an extremely severe condition that the upper punch and lower punch of the working example was used to continuously produce tablets from a powder material not containing a lubricant, which means that the tableting surface layer of the upper punch and the lower punch of the working example is very excellent as a tableting face.

Figure 9:
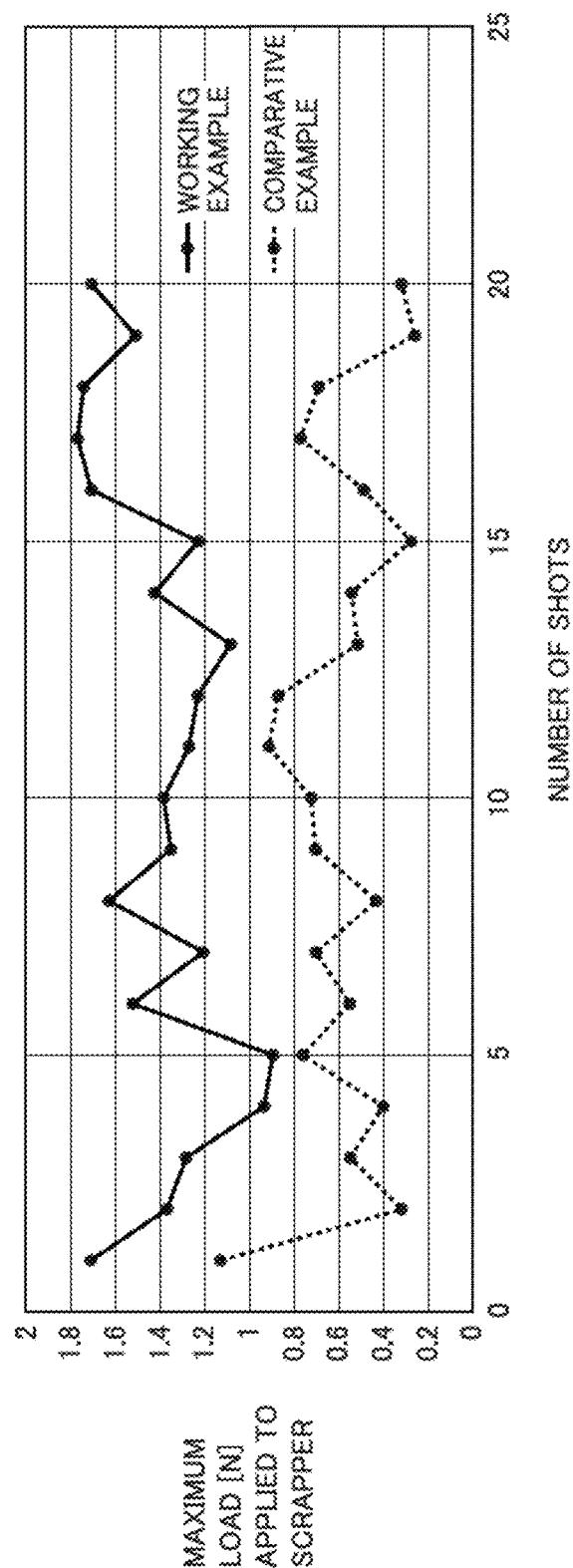
FIG. 9 is a graph illustrating the relationship between the number of shots and a maximum load [N] applied to a scraper when scrapping out each tablet after each shot of continuous tableting.

In the confirmation test on the surface condition of each of the above described tablets, the tablet was taken out by a scraper after each shot of continuous tableting, and the maximum load [N] applied to the scraper when scraping out each tablet was measured. The results are illustrated in FIG. 9. In FIG. 9, the horizontal axis represents the number of shots of continuous tableting, and the vertical axis represents the maximum load [N] applied to the scraper.

As illustrated in FIG. 9, at any number of shots of continuous tableting, the maximum load applied to the scraper in the case where the upper punch and the lower punch of the comparative example were used was lower than the maximum load applied to the scraper in the case where the upper punch and the lower punch of the working example were used. The considerable reason may be that after tableting, since a white film adhered to the tableting surface layer of the upper punch and the lower punch of the comparative example, the maximum frictional force between the white film adhered to the tableting surface layer and the surface of the tablet was measured as the maximum load applied to the scraper.

On the other hand, since no such white film adheres to the tableting surface layer of the upper punch and the lower punch of the working example, the maximum frictional force between the tableting surface layer of the lower punch and the surface of the tablet was measured as the maximum load applied to the scraper.

<Tableting Test for Supplement Tablets>

A powder material containing ascorbic acid (vitamin C) as the main agent instead of IBU, lactose as an excipient and magnesium stearate as a lubricant (blending amount: 0.4%) was prepared, and a tableting test for supplement tablets was performed. The conditions for this test are the same as those described above except the powder material.

Even in this test, the tableting was well performed by using the upper punch and the lower punch of the working example as compared with the case by using the upper punch and the lower punch of the comparative example. Therefore, the upper punch and the lower punch of the working example may improve the smoothness of the surface of the tablet after continuous tableting, and thereby may be used for a longer time as compared with the upper punch and the lower punch of the comparative example.

Embodiments and working examples of the present invention are described above. However, proper combinations of the constitutions of the respective embodiments and the respective specific examples are also originally intended.

In the above embodiments and working examples, the description has been carried out on the case where the tableting surface layer including crystalline yttrium oxide containing nitrogen and a group 4A element is used in both the upper punch and the lower punch. However, such tableting surface layer may be used in any one of the upper punch and the lower punch or may be used in least a part of the contact surface in contact with the powder material in place of the upper punch and/or the lower punch or in combination with the upper punch and/or the lower punch.

It should be understood that the embodiments and the examples disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST

11: tableting machine; 12: turntable; 13: die; 14: upper punch; 14a: punch tip; 14b: head portion; 15: upper punch holder; 16: lower punch; 16a: punch tip; 16b: head portion; 17: lower punch holder; 18: upper punch guiding rail; 19: lower punch guiding rail; 20: tableting surface layer; 30: intermediate layer; 31: buffer layer;

31A: first buffer layer; 31B: second buffer layer; 32A: first adhesive layer; 32B: second adhesive layer; 32C: third adhesive layer; 32D: fourth adhesive layer

The invention claimed is:

1. A tableting punch or die comprising:
a base material; and
a tableting surface layer on the base material, the tableting surface layer including crystalline yttrium oxide containing nitrogen and a group 4A element.

2. The tableting punch or die according to claim 1, further comprising an intermediate layer between the base material and the tableting surface layer.

3. The tableting punch or die according to claim 2, wherein the intermediate layer includes a buffer layer and an adhesive layer.

4. The tableting punch or die according to claim 3, wherein the buffer layer is a monolayer.

5. The tableting punch or die according to claim 3, wherein the buffer layer is a multilayer.

6. The tableting punch or die according to claim 3, wherein the adhesive layer is a monolayer.

7. The tableting punch or the die according to claim 6, wherein the adhesive layer is disposed either between the base material and the buffer layer or between the buffer layer and the tableting surface layer.

8. The tableting punch or die according to claim 3, wherein the adhesive layer is a multilayer.

9. The tableting punch or die according to claim 8, wherein the adhesive layer is disposed between the base material and the buffer layer and/or between the buffer layer and the tableting surface layer.

10. The tableting punch or die according to claim 3, wherein the intermediate layer includes a portion with a hardness higher than that of the base material and a toughness higher than that of the tableting surface layer.

11. The tableting punch or die according to claim 3, wherein the buffer layer has a hardness higher than that of the base material at least at a surface portion closer to the tableting surface layer.

12. The tableting punch or die according to claim 3, wherein the buffer layer is a layer whose hardness continuously changes due to a change in its composition.

13. The tableting punch or die according to claim 3, wherein the buffer layer contains a nitride, a carbide or an oxide having a general formula of M-A (M is titanium, chromium, nickel, zirconium, aluminum or silicon, and A is nitrogen, carbon or oxygen).

14. The tableting punch or die according to claim 3, wherein the adhesive layer contains at least one metal selected from the group consisting of titanium, chromium, nickel, zirconium, yttrium, aluminum and silicon, or an oxide of the metal.

15. The tableting punch or die according to claim 1, wherein the tableting punch or die is used for tableting at least one selected from the group consisting of pharmaceuticals, agricultural chemicals, fertilizers, foods and toiletries.

16. A tableting machine comprising the tableting punch or die according to claim 1.

* * * * *